Jan. 12, 1971 D. N. HARVEY, JR 3,555,469

WIDE RANGE VOLTAGE CONTROLLED OSCILLATOR

Filed Aug. 13, 1968

Dyas N. Harvey Jr.
INVENTOR.

BY Frank Wattles

ATTORNEY

United States Patent Office
3,555,469
Patented Jan. 12, 1971

3,555,469

WIDE RANGE VOLTAGE CONTROLLED OSCILLATOR

Dyas N. Harvey, Jr., Gardena, Calif., assignor to TRW Inc., Redondo Beach, Calif., a corporation of Ohio Filed Aug. 13, 1968, Ser. No. 752,278
Int. Cl. H03k 3/26
U.S. Cl. 331—111 4 Claims

ABSTRACT OF THE DISCLOSURE

A voltage controlled oscillator (VCO) for producing square waveforms over a wide, linearly controlled frequency range. The VCO comprises a comparator having a noninverting feedback loop, an inverting feedback loop, and a signal output. There is a resistor in the noninverting feedback loop and a differentiator in the form of a capacitor in the inverting feedback loop. The noninverting and inverting feedback loops connect the signal output with respective inputs to the comparator and a series resistor and variable resistor are positioned between the two loops to regulate oscillation frequency. A point between the resistor and variable resistor is adapted to be grounded. When the square wave produced by the comparator passes through the resistor in the noninverting feedback loop a diminished reference signal is produced; when the square wave passes through the differentiator in the inverting feedback loop, the waveform decays and a differentiated square wave is produced. The differential square wave and the reference signal are compared in the comparator and when the two signals cross at a common voltage the square wave produced by the comparator is triggered in the reverse direction causing oscillation to occur. This simplified circuit can be linearly controlled over a tuning range of several octaves.

BACKGROUND OF THE INVENTION

(1) Field of the invention

A voltage controlled oscillator, and more specifically a voltage controlled oscillator employing a Wien bridge for producing symmetrical square waveforms over a wide, linearly controlled frequency range by using the decay of a differentiator waveform to signal the reversal of output voltage when the decay equals the peak of a reference input.

(2) Description of the prior art

Conventional VCO circuits have utilized two methods for obtaining wide range tuning: the single oscillator circuit and the double oscillator circuit.

The conventional single oscillator circuit employs a Wien bridge coupled to a noninverting amplifier having a positive feedback loop and a negative feedback loop. The negative feedback loop has resistance and is frequency insensitive. The positive feedback has resistance and capacitance and is frequency sensitive. By varying either the resistance or capacitance in the bridge, the frequency can be controlled. When the positive feedback voltage is exactly in phase with the output voltage from the amplifier and is equal or almost equal to the negative voltage, oscillation occurs. Linear control is possible over about one frequency decade with this conventional single oscillator circuit.

The double oscillator circuit produces the desired output by differencing the individual outputs from each oscillator. Although linear control is possible over several frequency decades, the circuit suffers from frequency instability and foldover problems, in addition to being more complex than the single oscillator circuit.

Conventional oscillator circuits generally produce sine waves although waveforms such as the square wave and sawtooth wave are produced also. The waveforms fluctuate in either the positive or negative regions. An example of a typical square wave oscillating in the positive region might oscillate between 0 and +5 volts. During a single cycle the signal would be triggered from 0 to +5 volts, where it would remain constant until triggered back to 0 volt.

The differentiated waveform of the invention presented herein differs from the conventional square wave. If the differentiated square wave were triggered as the square wave described above from 0 to +5 volts, the waveform would not remain constant, but would decay to some voltage less than +5 and greater than 0 volts. Assuming the decay stopped at +2 volts, the waveform would then be triggered 5 volts in the negative direction from +2 to −3 volts, where the waveform would again decay from −3 volts back to 0. The fluctuation of this example would cover the region between −3 and +5 volts during an entire cycle.

A phase shifting technique is used by conventional circuits to signal the triggering of waveforms between their maximum and minimum values. Signalling in the phase shifting technique results from the comparison of two similar waveforms, one of which is shifted horizontally to the right or left. In the invention described herein, a different technique is used whereby the decay of a differentiated square wave is compared with a reference square wave to signal triggering.

Three patents relating to the conventional art, and more specifically to the single oscillator circuit, are: 3,229,228, Adjustable Frequency Wien-Bridge Oscillator; 3,127,577, Freqency Controlled Oscillator, and 3,144,619, Oscillation Generator Having an Amplitude Stabilizing Circuit.

The present invention improves upon prior art inventions by utilizing a more simplified circuit to produce a symmetrical square wave and by utilizing the differentiated square wave to signal the abrupt shift of output voltage. The wide frequency range can be linearly controlled as a function of voltage over several frequency decades.

SUMMARY OF THE INVENTION

Briefly, this invention provides a voltage controlled oscillator for producing square waveforms. The voltage controlled oscillator comprises a voltage comparator having first and second input terminals and an output terminal. A first feedback loop connects the output terminal to the first input terminal of the comparator, and a second feedback loop connects the output terminal to the second input terminal of the comparator. There is further provided a differentiator in the first feedback loop and resistance in the second feedback loop. Control means is connected intermediate the first and second input terminals for adjusting the rate of square wave voltage decay resulting from the differentiator and for adjusting the switching rate of the comparator. A resistor is interposed between the control means and the second input terminal, the connection between the control means and the resistor being adapted to be connected to ground.

DESCRIPTION OF THE PREFERRED EMBODIMENTS

Figure 1:
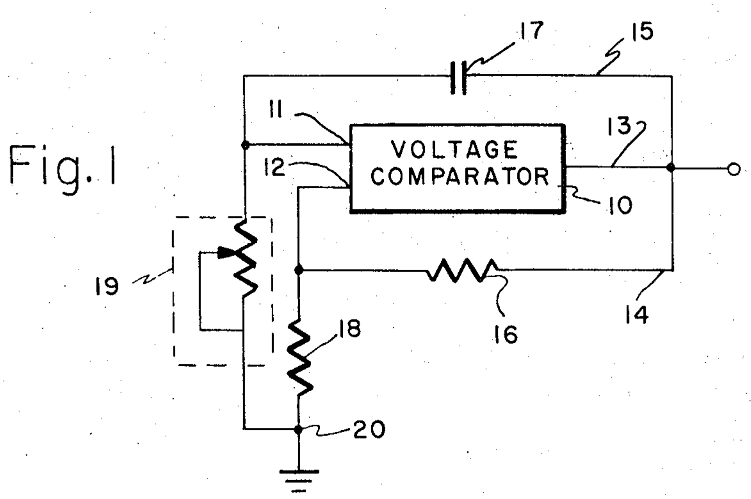
FIG. 1 is a schematic of an embodiment of the invention.

Referring to FIG. 1, the voltage controlled oscillator (VCO) comprises a voltage comparator 10 having input terminals 11 and 12 and output terminal 13, a noninverting feedback loop 14 connecting output terminal 13 with input terminal 12, and an inverting feedback loop 15 connecting output terminal 13 with input terminal 11. A resistor 16 is connected in loop 14 and a differentiator 17 is connected in loop 15. Terminal 11 is connected to terminal 12 through a series connection of a resistor 18 and control means 19. A point 20 intermediate resistor 18 and control means 19 is adapted to be grounded.

Differentiator 17 is illustrated as a capacitor, but it is understood any known element capable of similar differentiation is intended. Control means 19 is exemplified by an adjustable resistor, but under appropriate conditions could be a fixed resistor, or any equivalent. Voltage comparator 10 can be any high-speed differential comparator employing a two-position switch such as a bistable multivibrator to produce a square-wave output. One such comparator successfully used in practice is the Fairchild high-speed differential comparator Model No. UA710C, which employs a Schmitt trigger for switching.

According to the operation of the VCO of FIG. 1, a symmetrical square wave is produced by the comparator 10 at output terminal 13. As current flows from output terminal 13 through differentiator 17 in inverting feedback loop 15, the voltage of the waveform decays. Simultaneously current flows from terminal 13 through resistor 16 in noninverting feedback loop 14 and the voltage of the square wave is decreased producing a reference signal at input terminal 12. The frequency of the output square wave of the VCO is determined by the discharge rate through the capacitance $C_x$ of differentiator 17 and resistance $R_x$ of control means 19, the discharge rate being represented by the equation $$TC \simeq 3R_x \cdot C_x$$

where TC represents the discharge rate. By varying resistance $R_x$ at control means 19, the rate of decay of the signal through differentiator 17 can be adjusted. When the voltage level of the decayed signal at terminal 11 equals the voltage level of the square wave reference signal at terminal 12, comparator 10 switches states to produce a square wave output at terminal 13. It is obvious, therefore, that because switching in comparator 10 occurs when the voltages of the decayed signal and reference signals are equal, the frequency of the VCO also is dependent upon the voltage level of the square wave reference signal. A variation of resistance in resistor 16 will vary the voltage level of the reference signal and thereby the frequency of the VCO will be varied proportionately.

Figure 2:
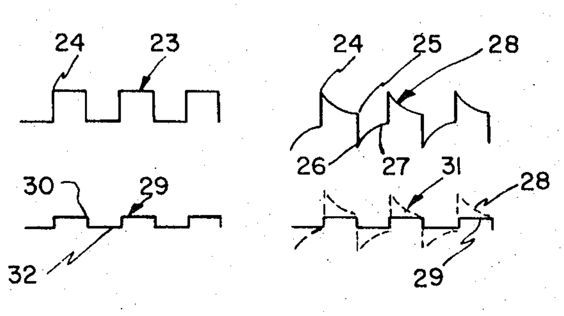
FIG. 2 illustrates various waveforms produced by the voltage controlled oscillator.

FIG. 2 illustrates the various waveforms produced by the VCO of FIG. 1. The output from the voltage comparator 10 is a symmetrical square wave 23. As current flows through differentiator 17 in the feedback loop 15, the voltage of square wave 23 decays alternately from peak voltage 24 to voltage 25 and from peak voltage 26 to voltage 27 of the decay signal 28. As current flows through resistor 16 in the feedback loop 14, the amplitude of voltage of square wave 23 is decreased resulting in reference signal 29 having amplitude 30. The voltage decay from voltage 24 continues at the rate set forth in the formula described above until voltage 25 equals voltage 30 of reference signal 29, as illustrated by waveform comparison 31. The detection of the coincidence of voltages of signals 28 and 29 at voltage 25 triggers the switching within comparator 10 and causes the voltage of signal 28 to shift by an amount equal to the amplitude of square wave signal 23 to a voltage represented by voltage 26. Repeating the process described, the voltage 26 decays to voltage 27 which is equal to voltage 32 of reference signal 29. The coincidence if voltages is detected in comparator 10 and there is triggered a switching of comparator output voltage by an amount equal to the amplitude of signal 23. This cycle of decay of the square wave signal until reversal waveform is repeated continuously, the rate of VCO frequency being varied by adjustment of control means 19 or in the alternative by adjustment of amplitude of signal 23 or signal 29. Consequently, for any change of voltage at the input, i.e., voltage across the control means 19, the square wave output will change in frequency. The change of VCO frequency is inversely proportional to VCO voltage input and the ratio remains substantially linear over a wide range of frequency.

The low frequency of the VCO is determined by maximum allowable values of capacitance, $C_x$, and resistance, $R_x$. The high frequency of the VCO is determined by comparator gain, input capacity, and switching time. Linear control exists when a variation in voltage at the VCO input is accompanied by an inversely proportionate variation in frequency. As the magnitude of control voltage is increased the frequency is decreased, and vice versa. Experiments have shown that the VCO of FIG. 1 can achieve substantially linear control over a frequency range of two to three decades.

Figure 3:
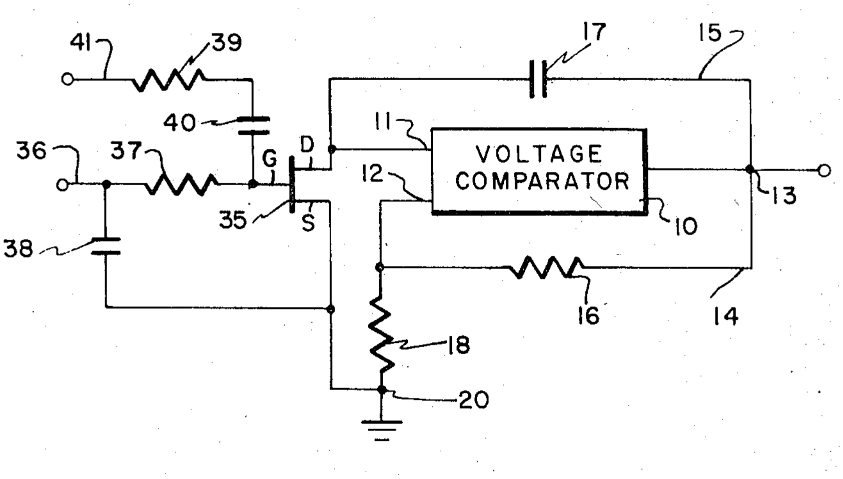
FIG. 3 is a schematic of another embodiment of the invention.

FIG. 3 illustrates a preferred embodiment of the invention. The embodiment includes the elements of the VCO of FIG 1, the control means 19 having substituted therefor a field effect transistor 35 with a drain connection D, a source connection S, and a gate connection G, and having a voltage input 36, a resistor 37 interposed between the gate connection G of the transistor 35 and voltage input 36, and a capacitor 38 connected between the input 36 and ground. To provide dither means for the VCO a resistor 39 and capacitor 40 are connected in series arrangement and interposed between the dither input 41 and the gate connection G of the transistor 35.

The operation of the VCO of FIG. 3 is basically as described for the VCO of FIG. 1 and the waveforms produced are those illustrated in FIG. 2 and above described. The addition of the dither means is optional. The dither means supplies a relatively low voltage peak-to-peak AC signal at low frequency for modulating the VCO frequency over the entire operating frequency range.

While certain embodiments of the invention have been described in detail herein and shown in the accompanying drawing, it will be evident that various additional modifications are possible in the arrangement and construction of its components without departing from the scope of the invention.

What is claimed is:

1. A voltage controlled oscillator comprising:

a voltage comparator for providing square waveform outputs, said voltage comparator having a non-inverting input terminal, an inverting input terminal, and an output terminal;

a first feedback loop connecting said output terminal to said inverting input terminal;

a second feedback loop connecting said output terminal to said noninverting input terminal;

a differentiator in said first feedback loop for differentiating said square waveforms;

a resistor in said second feedback loop;

control means connected to said inverting input terminal and ground for regulating the rate of decay of said differentiated waveforms; and a resistor connected to said noninverting input terminal and ground.

2. A voltage controlled oscillator as in claim 1 wherein said control means comprises a variable resistor.

3. A voltage controlled oscillator as in claim 1 wherein said control means comprises:

a field effect transistor having a drain connection connected to said inverting input, a source connection connected to ground, and a gate connection;

a voltage input terminal adapted to be connected to a source of input voltage;

an input resistor connector to said voltage input terminal and said gate connection; and a capactior connected to said voltage input terminal and ground.

4. A voltage controlled oscillator as in claim 3 further comprising:

a dither input terminal adapted to be connected to a dither source for modulating oscillator frequency; and a series arrangement of a resistor and capacitor connected to said dither input terminal and said field effect transistor gate connector.

References Cited

UNITED STATES PATENTS 3,295,069 12/1966 Perry -------------- 331—143

JOHN KOMINSKI, Primary Examiner

U.S. Cl. X.R.

328—127